(12) United States Patent
Zhang et al.

(10) Patent No.: US 10,539,724 B2
(45) Date of Patent: Jan. 21, 2020

(54) ARRAY SUBSTRATE, METHOD FOR MANUFACTURE THEREOF AND DISPLAY DEVICE

(71) Applicant: BOE TECHNOLOGY GROUP CO., LTD., Beijing (CN)

(72) Inventors: Feng Zhang, Beijing (CN); Zhanfeng Cao, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 51 days.

(21) Appl. No.: 15/544,121

(22) PCT Filed: Mar. 11, 2016

(86) PCT No.: PCT/CN2016/076130
§ 371 (c)(1),
(2) Date: Jul. 17, 2017

(87) PCT Pub. No.: WO2016/173325
PCT Pub. Date: Nov. 3, 2016

(65) Prior Publication Data
US 2017/0371078 A1    Dec. 28, 2017

(30) Foreign Application Priority Data

Apr. 30, 2015  (CN) .......................... 2015 1 0218189

(51) Int. Cl.
*G02B 5/20*       (2006.01)
*H01L 27/12*     (2006.01)

(52) U.S. Cl.
CPC .............. *G02B 5/20* (2013.01); *H01L 27/124* (2013.01); *H01L 27/1248* (2013.01); *H01L 27/1262* (2013.01); *H01L 27/1288* (2013.01)

(58) Field of Classification Search
CPC ..... G02B 5/20; G02B 5/201; G02F 1/136209; G02F 1/133512; G02F 1/133509;
(Continued)

(56) References Cited

U.S. PATENT DOCUMENTS

2009/0152555 A1   6/2009   Park et al.
2014/0368770 A1   12/2014  Chae et al.

FOREIGN PATENT DOCUMENTS

CN   101526685 A   9/2009
CN   102681245 A   9/2012
(Continued)

OTHER PUBLICATIONS

English translation of PCT International Search Report, Application No. PCT/CN2016/076130, dated May 27, 2016, 2 pages.
(Continued)

*Primary Examiner* — Marin Pichler
(74) *Attorney, Agent, or Firm* — Armstrong Teasdale LLP

(57) ABSTRACT

Embodiments of the present disclosure provide an array substrate including a plurality of pixel regions arranged in an array and a black matrix located between the pixel regions, the black matrix including an outward convex curved surface, wherein a material of the black matrix include metal, metal oxide, and metal nitride. The array substrate provided by the present disclosure can effectively reduce the reflectivity of the display panel and improve the image quality.

10 Claims, 5 Drawing Sheets

(58) Field of Classification Search
CPC ............... H01L 27/124; H01L 27/1248; H01L 27/1262; H01L 27/1288
USPC ........................................................ 359/893
See application file for complete search history.

(56) References Cited

FOREIGN PATENT DOCUMENTS

| | | |
|---|---|---|
| CN | 102681276 A | 9/2012 |
| CN | 103713416 A | 4/2014 |
| CN | 104102052 A | 10/2014 |
| CN | 104166280 A | 11/2014 |
| CN | 104317097 A | 1/2015 |
| CN | 104536194 A | 4/2015 |
| CN | 104765191 A | 7/2015 |
| JP | 2000098368 A | 4/2000 |

OTHER PUBLICATIONS

PCT Written Opinion, Application No. PCT/CN2016/076130, dated May 27, 2016, 13 pages.: with English translation.
China First Office Action, Application No. 201510218189.6, dated Mar. 17, 2017, 16 pps.: with English translation.

ARRAY SUBSTRATE, METHOD FOR MANUFACTURE THEREOF AND DISPLAY DEVICE

CROSS REFERENCE TO RELATED APPLICATIONS

This patent application is a National Stage Entry of PCT/CN2016/076130 filed on Mar. 11, 2016, which claims the benefit and priority of Chinese Patent Application No. 201510218189.6 filed on Apr. 30, 2015, the disclosures of which are incorporated herein in their entirety as part of the present application.

BACKGROUND

Embodiments of the present disclosure relate to an array substrate and a method for manufacture thereof and a display device.

Display devices such as Liquid crystal display, organic light-emitting display (referred to as OLED), and other display devices have become a necessity in people's lives. With the improvement of people's needs, in order to improve display quality of the display device and to avoid the problems of low aperture ratio and light leakage of the display device caused by a deviation of an array substrate and a color film substrate when they form a cell, a technology of integrating a color filter and the array substrate together (Color Filter on Array, referred to as COA) comes into being. The COA technology is a technology that places a black matrix and the color filter on the array substrate.

The conventional black matrix is generally composed of carbon black particles coated with resin, and its dielectric constant is large. The black matrix in the conventional COA substrate is generally provided between gate lines and common electrodes and/or between data lines and the common electrodes so that a large parasitic capacitance produces between the common electrodes and the gate lines and/or the common electrodes and the data lines, resulting in a larger signal delay and reducing the display quality of the display device.

In order to solve the above-mentioned problems, the black matrix can be made of a metal material instead of a resin material coating carbon black particles. However, since the metal material has a certain reflectivity, the metallic black matrix in the display panel will reflect light, resulting in a decrease in the contrast of the display, affecting the image quality. Moreover, the reflectivity of the display panel is related to the area of the metallic black matrix, and the larger the area, the larger the reflectivity.

BRIEF DESCRIPTION

The present disclosure provides an array substrate, a method for manufacture thereof, and a display device that can solve the problem of reducing the display quality of the conventional array substrate due to the high reflectivity of the metal material.

A first aspect of the present disclosure provides an array substrate including a plurality of pixel regions arranged in an array and a black matrix located between the pixel regions, the black matrix including an outward convex curved surface, and wherein a material of the black matrix includes at least one of metal, metal oxide, and metal nitride.

According to an embodiment of the present disclosure, a thickness of the black matrix is uniform, and a region corresponding to the outward convex curved surface in a predetermined layer below the black matrix has a convex curved structure having a thickness larger than a thickness of a flat area.

According to an embodiment of the present disclosure, a height difference between an apex of the convex curved structure of the predetermined layer and an upper surface of the flat area is greater than 1 μm.

According to an embodiment of the present disclosure, the array substrate further includes a color filter and an organic flat layer formed on the color filter, and the predetermined layer is the organic flat layer.

According to an embodiment of the present disclosure, the array substrate further includes a layer of common electrodes between the organic flat layer and the black matrix, and the black matrix is provided on the layer of common electrodes.

According to an embodiment of the present disclosure, the array substrate further includes a layer of common electrodes and a passivation layer between the organic flat layer and the black matrix, and the black matrix is provided on the passivation layer.

According to an embodiment of the present disclosure, the array substrate further includes a layer of common electrodes, a passivation layer, and a layer of pixel electrodes between the organic flat layer and the black matrix, and the black matrix is provided on the layer of pixel electrodes.

According to an embodiment of the present disclosure, a material of the black matrix includes at least one of molybdenum, chromium, aluminum, titanium, and copper, at least one of the corresponding metal oxide and metal nitride of the molybdenum, chromium, aluminum, titanium, and copper or at least one of molybdenum tantalum oxide, molybdenum titanium oxide, molybdenum tantalum nitride, and molybdenum titanium nitride.

A second aspect of the present disclosure provides a display device including an array substrate as described above.

A third aspect of the present disclosure provides a method for manufacturing an array substrate, including forming a plurality of pixel regions arranged in an array on a substrate on which a black matrix is not provided and forming a black matrix provided between the pixel regions, the black matrix includes an outward convex curved surface, wherein a material of the black matrix includes at least one of metal, metal oxide, and metal nitride.

According to an embodiment of the present disclosure, a thickness of the black matrix is uniform, and a region corresponding to the outward convex curved surface of the black matrix is formed as an convex curved structure having a thickness larger than a thickness of a flat area when forming a predetermined layer below the black matrix before forming the black matrix.

According to an embodiment of the present disclosure, the method for manufacturing the array substrate further includes forming a color filter, and forming an organic flat layer on the color filter, and the predetermined layer is the organic flat layer.

According to an embodiment of the present disclosure, a gray-scale exposure process is used to form the outward convex curved structure when forming the organic flat layer.

According to an embodiment of the present disclosure, the method further includes forming a layer of common electrodes between forming the organic flat layer and forming the black matrix, wherein the black matrix is provided on the layer of common electrodes.

According to an embodiment of the present disclosure, the method further includes forming a layer of common electrodes and a passivation layer between forming the organic flat layer and forming the black matrix, wherein the black matrix is provided on the passivation layer.

According to an embodiment of the present disclosure, the method further includes forming a layer of common electrodes, a passivation layer, and a layer of pixel electrodes between forming the organic flat layer and forming the black matrix, wherein the black matrix is provided on the layer of pixel electrodes.

According to an embodiment of the present disclosure, a material of the black matrix includes at least one of molybdenum, chromium, aluminum, titanium, and copper, at least one of the corresponding metal oxide and metal nitride of the molybdenum, chromium, aluminum, titanium, and copper, or at least one of molybdenum tantalum oxide, molybdenum titanium oxide, molybdenum tantalum nitride, and molybdenum titanium nitride.

It can be understood from the solutions described above that the surface of the black matrix on the array substrate of the present disclosure is not a flat structure but the outward convex curved surface, so that an effect of specular reflection of the black matrix can be greatly reduced, the reflectance of the display panel can be reduced, and the image quality can be improved.

BRIEF DESCRIPTION OF THE DRAWINGS

In order to more clearly illustrate the technical solution of the embodiments of the present disclosure, the drawings of the embodiments will be briefly described below. It will be apparent that the drawings in the following description are merely illustrative of some embodiments of the disclosure and are not intended to be limiting of the disclosure.

DETAILED DESCRIPTION

To make the technical solutions and advantages of embodiments of the disclosure more clear, the technical solutions of embodiments of the disclosure will be described below clearly and completely in connection with the accompanying drawings of embodiments of the disclosure. It is obvious that the described embodiments are only some, but not all the embodiments of the disclosure. Based on the embodiments of the disclosure, all the other embodiments made by those of ordinary skill in the art without the premise of creative work belong to the scope of protection of the disclosure.

Embodiments of the present disclosure provide an array substrate including a plurality of pixel regions arranged in an array and a black matrix located between the pixel regions, the black matrix including an outward convex curved surface, wherein the material of the black matrix includes at least one of metal, metal oxide, and metal nitride.

A thickness of the black matrix is uniform, and a region corresponding to the outward convex curved surface in a predetermined layer below the black matrix has a convex curved structure having a thickness larger than a thickness of a flat area.

In one embodiment, a height difference between an apex of the convex curved structure of the predetermined layer and an upper surface of the flat area is greater than 1 μm.

In one embodiment, the array substrate is a COA (Color Filter on Array) array substrate, and the array substrate further includes a color filter and an organic flat layer formed on the color filter, wherein the predetermined layer is preferably the organic flat layer. That is, the region corresponding to the outward convex curved surface of the black matrix in the organic flat layer has the convex curved structure having a thickness larger than a thickness of the flat area. In an embodiment, the height difference between an apex of the convex curved structure of the organic flat layer and the upper surface of the flat area is greater than 1 μm to ensure that a suitable convex structure is formed to reduce the reflectivity of the material of the black matrix.

Figure 1:
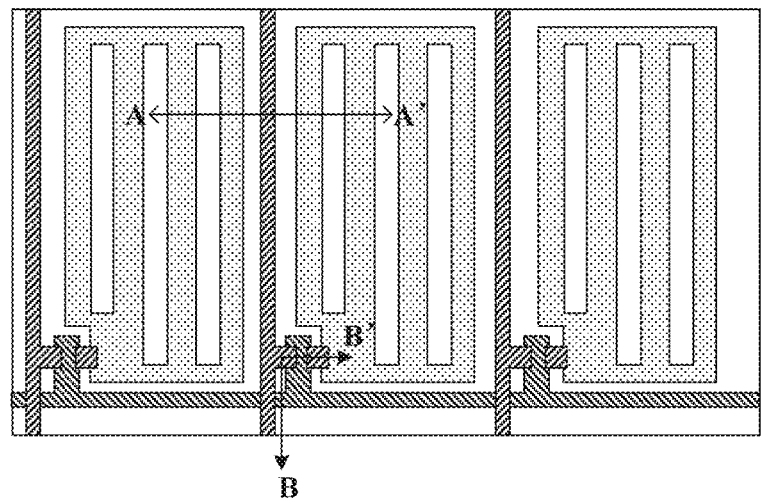
FIG. 1 is a top view of an array substrate according to an embodiment of the present disclosure.
Figure 2:
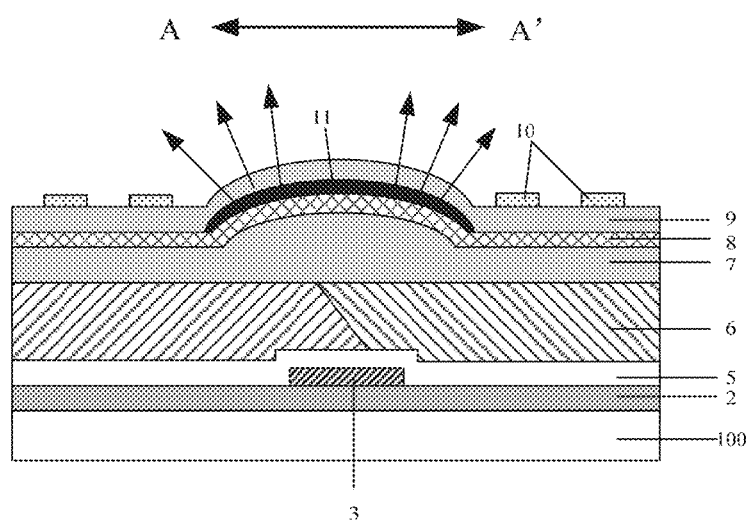
FIG. 2 is a schematic structural view of the A-A' plane of the array substrate shown in FIG. 1.
Figure 3:
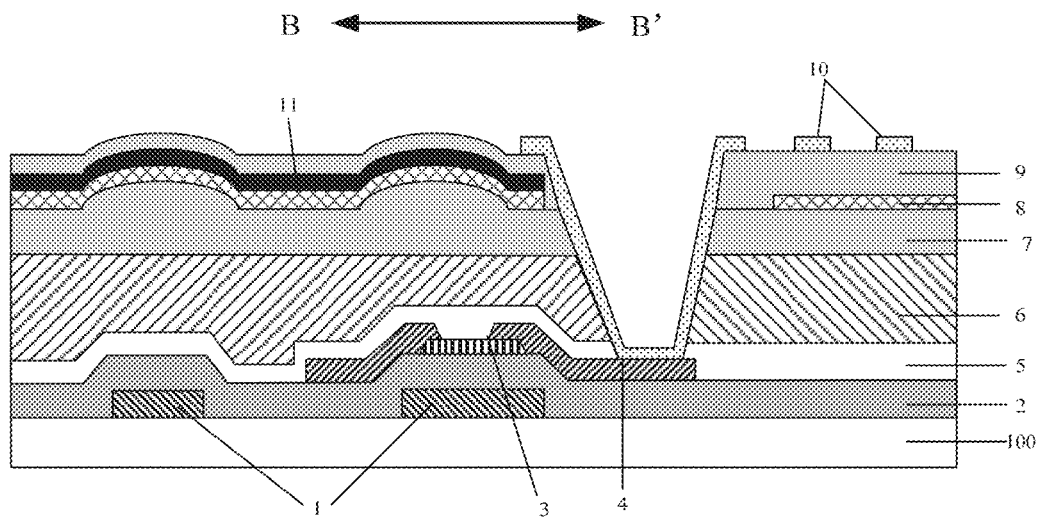
FIG. 3 is a schematic structural view of the B-B' plane of the array substrate shown in FIG. 1.

With reference to FIGS. 1-3, FIG. 1 is a top view of an array substrate according to an embodiment of the present disclosure, FIG. 2 is a schematic structural view of the A-A' plane of the array substrate shown in FIG. 1, and FIG. 3 is a schematic structural view of the B-B' plane of the array substrate shown in FIG. 1. The array substrate includes, in addition to the color filter 6 and the organic flat layer 7 described above, a layer of common electrodes 7 between the organic flat layer 7 and the black matrix 11, and the black matrix 11 is provided on the layer of common electrodes 8.

With reference to FIGS. 2-3, reference number 100 denotes a substrate, reference number 1 denotes a gate line, reference number 2 denotes a gate insulation layer, reference number 3 denotes an active layer, reference number 4 denotes a data line and a source and a drain, reference number 5 denotes a first passivation layer, reference number 6 denotes an R/G/B color filter, reference number 7 denotes an organic flat layer, reference number 8 denotes a layer of common electrodes, reference number 9 denotes a second passivation layer, reference number 10 denotes a layer of pixel electrodes, and reference number 11 denotes a black matrix. The corresponding reference numbers in FIGS. 4-5 also denotes the same content, which will not be described one by one in detail.

Figure 4:
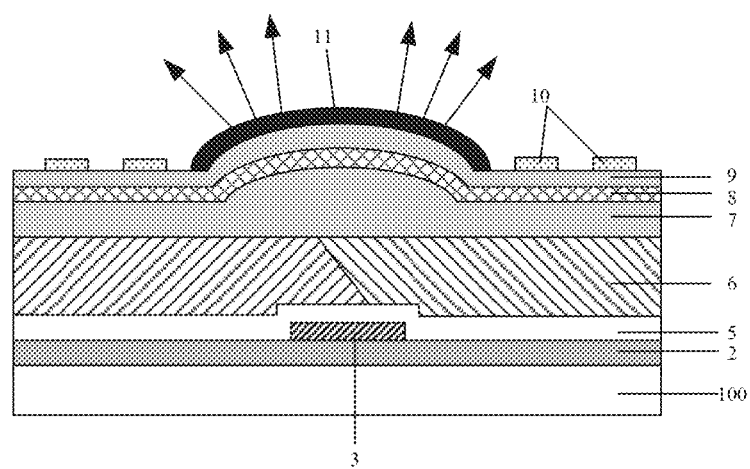
FIG. 4 is a schematic structural view of the A-A' plane of the array substrate of FIG. 1 according to another embodiment of the present disclosure.

Referring to FIG. 4, FIG. 4 is a schematic structural view of the A-A' plane of the array substrate of FIG. 1 according to another embodiment of the present disclosure. The array substrate includes, in addition to the color filter 6 and the organic flat layer 7 described above, the layer of common electrodes 8 and the passivation layer 9 between the organic flat layer 7 and the black matrix 11, and the black matrix 11 is provided on the passivation layer 9.

Figure 5:
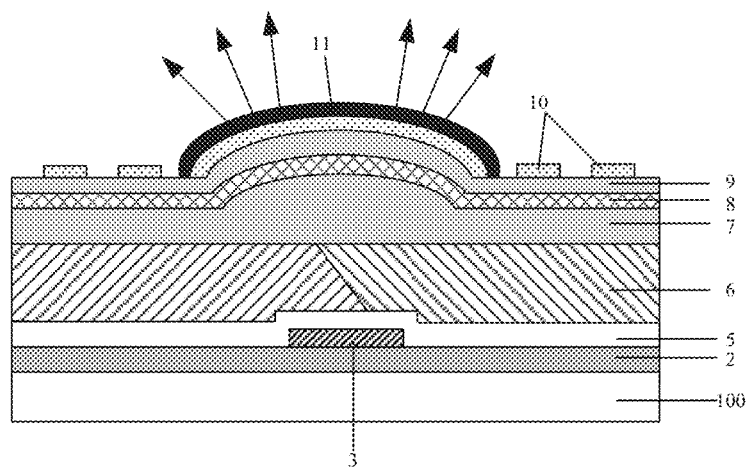
FIG. 5 is a schematic structural view of the A-A' plane of the array substrate of FIG. 1 according to another embodiment of the present disclosure.

Referring to FIG. 5, FIG. 5 is a schematic structural view of the A-A' plane of the array substrate of FIG. 1 according to another embodiment of the present disclosure. The array substrate includes, in addition to the color filter 6 and the organic flat layer 7 described above, the layer of common electrodes 8, the passivation layer 9, and the layer of pixel electrodes 10 between the organic flat layer 7 and the black matrix 11, wherein the black matrix 11 is provided on the layer of pixel electrodes 10.

The above-described embodiments separately describe the specific arrangement of the location of the black matrix in the array substrate according to embodiments of the present disclosure. As can be seen from FIGS. 2, 4, and 5, the location of the black matrix is not limited and the black matrix may be selectively provided on the layer of common electrodes 8, the passivation layer 9, or the layer of pixel electrodes 10 as desired or as required by a manufacturing process.

In addition, the black matrix may be provided at other locations as long as the black matrix is the convex curved structure and the region corresponding to the outward convex curved surface in the predetermined layer below the black matrix has the convex curved structure having a thickness larger than a thickness of the flat area.

In addition, it should be noted that the other layers (if any) between the black matrix and the predetermined layer below the black matrix also have the outward convex curved surface similar to the black matrix.

In one embodiment, a material of the black matrix 11 described above is a material of metal, metal oxide, or nitride having a low reflectivity, including at least one of molybdenum, chromium, aluminum, titanium, and copper or at least one of the corresponding metal oxide and metal nitride of the molybdenum, chromium, aluminum, titanium, and copper or at least one of molybdenum tantalum oxide, molybdenum titanium oxide, molybdenum tantalum nitride, and molybdenum titanium nitride.

Since the surface of the black matrix on the array substrate according to the embodiment of the present disclosure is not a flat structure but the outward convex curved surface, so that the effect of specular reflection of the black matrix can be greatly reduced, the reflectance of the display panel can be reduced, and the image quality can be improved.

The material of the black matrix according to the embodiment of the present disclosure is a metal, a metal oxide, or a metal nitride having a low reflectivity, so that the reflection effect of the black matrix can be effectively improved and the image quality can be improved.

Figure 7:
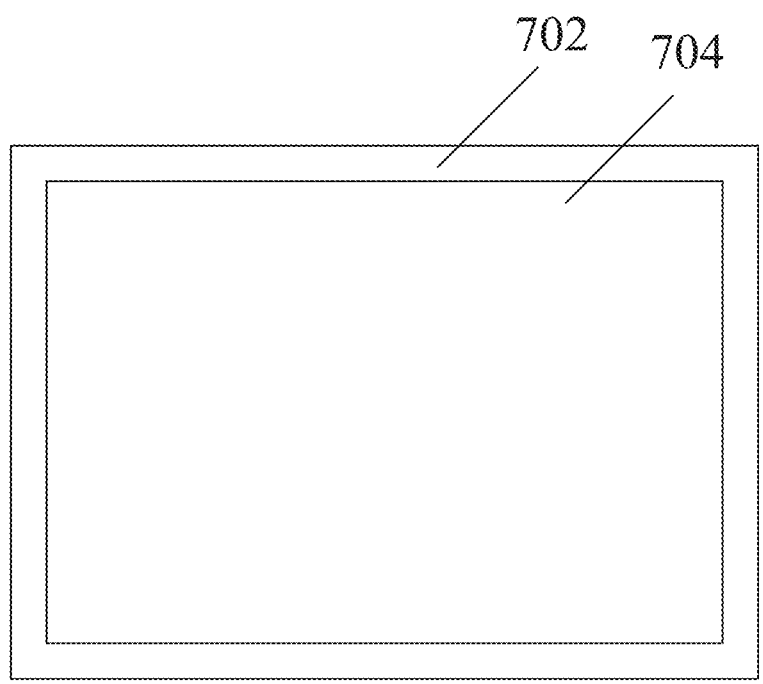
FIG. 7 is a schematic structural view of a display device according to an embodiment of the present disclosure.

An embodiment of the present disclosure further provides a display device including the array substrate as described in the above embodiments. FIG. 7 is a schematic structural view of a display device 702 according to an embodiment of the present disclosure. As shown in FIG. 7, the display device 702 includes the array substrate 704 as described in the above embodiments.

The display device according to the present embodiment can effectively reduce the effect of specular reflection of the metallic material and reduce the reflectivity of the display panel since the black matrix having the outward convex curved surface of the above embodiments is used in the array substrate. Thus, the display device has a good display effect and picture quality.

The display device described in the present embodiment may include any products or parts with the displaying ability, such a mobile phone, an electronic paper, a tablet computer, a video camera, a camera, a television set, or a navigator.

An embodiment of the present disclosure further provides a method for manufacturing an array substrate, the method including forming a plurality of pixel regions arranged in an array on a substrate on which a black matrix is not provided and forming a black matrix provided between the pixel regions, wherein the black matrix includes an outward convex curved surface, and wherein a material of the black matrix includes at least one of metal, metal oxide, and metal nitride.

In an embodiment, a thickness of the black matrix is uniform and a convex curved structure having a thickness larger than a thickness of a flat area is formed at a region corresponding to the outward convex curved surface of the black matrix when forming the predetermined layer below the black matrix before forming the black matrix.

In one embodiment, the array substrate according to the embodiment of the present disclosure is a COA array substrate, the predetermined layer is an organic flat layer, and specifically, the method for manufacturing the array substrate includes:

A1. forming a color filter;

A2. forming an organic flat layer on the color filter;

A3. a gray-scale exposure process is used to form the outward convex curved structure when forming the organic flat layer, wherein the thickness of the convex curved structure is greater than the thickness of a flat area of the layer; and A4. forming the black matrix over the organic flat layer, and the black matrix is formed directly above the convex curved structure, and the black matrix is an outward convex curved surface and its thickness is uniform.

In addition, forming the black matrix over the organic flat layer may include several cases, wherein the first case is that the black matrix is provided on the layer of common electrodes on the organic flat layer, the second case is that the black matrix is provided on the passivation layer on the organic flat layer and the layer of common electrodes, and the third case is that the black matrix is provided on the layer of pixel electrodes on the organic flat layer, the layer of common electrodes and the passivation layer.

Figure 6:
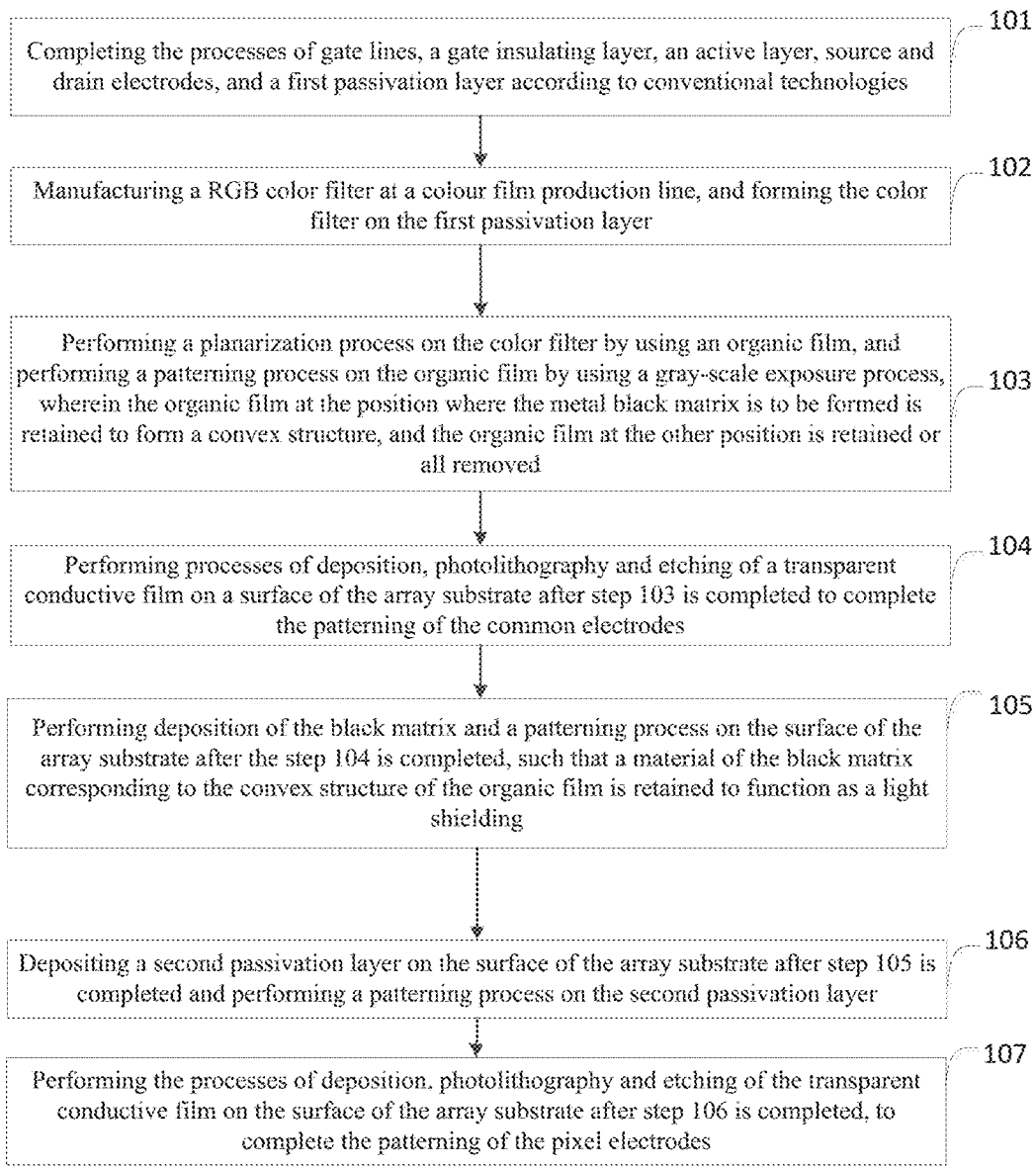
FIG. 6 is a flow chart showing a method of manufacturing an array substrate according to an embodiment of the present disclosure.

As for the first case, referencing to FIG. 6, the method for manufacturing an array substrate according to an embodiment of the present disclosure includes:

Step 101: completing the processes of gate lines, an insulating layer for gate, an active layer, sources and drains, and a first passivation layer according to conventional technologies.

Step 102: manufacturing a RGB color filter and forming the color filter on the first passivation layer.

Step 103: performing a planarization process on the color filter by using an organic film, and performing a patterning process on the organic film by using a gray-scale exposure process, so that the organic film forms a convex curved structure. For example, the organic film may be made of a resin material having a photosensitive property, and the thickness of the organic film in different regions can be adjusted directly by controlling the amount of light transmitted through different regions of the gray scale mask.

In this step, the convex curved structure of organic film corresponds to all or part of the gate line, the data line, and the thin film transistor, and the height difference between an apex of the convex curved structure and the upper surface of the flat area is greater than 1 μm to ensure that the effect of specular reflection is greatly reduced after the material of the black matrix is deposited on the convex curved structure.

Step 104: performing processes of deposition, photolithography and etching of the transparent conductive film on the surface of the array substrate of step 103 to complete the patterning of the common electrodes.

Step 105: performing deposition of the black matrix and a patterning process on the surface of the array substrate on which the step 104 is completed, such that the material of the black matrix corresponding to the convex curved structure of the organic film arc is retained to function as a light shielding.

In this step, since the surface of the material of the black matrix is no longer a flat surface, the effect of its specular reflection is greatly reduced, the reflectivity of the display panel is reduced, the picture quality is improved, the reflectance of the display panel is reduced, and the image quality is improved, and the material of the black matrix and the electrical connections of common electrodes can improve the homogeneity of the common electrodes.

In this step, the black matrix is manufactured by depositing in a $Ar/O_2$ or $Ar/N_2$ atmosphere by using a material of metal or metal alloy as a target material and using sputtering method, the specific manufacturing parameters can be found in Table 1 below. In general, the black matrix has a thickness of 2 to 4 µm and an optical density per unit thickness is 1-2 µm.

TABLE 1

| substrate temperature ° C. | power kW | pressure Pa | gas flow sccm |
|---|---|---|---|
| 120 | 12 | 0.3 | Ar 100<br>$O_2$ or $N_2$ 0~20 |

Wherein a material of the black matrix is generally selected from at least one of metal, metal oxide, or nitride having a low reflectivity, including at least one of molybdenum, chromium, aluminum, titanium, and copper, at least one of the corresponding metal oxide and metal nitride of the molybdenum, chromium, aluminum, titanium, and copper, or at least one of molybdenum tantalum oxide, molybdenum titanium oxide, molybdenum tantalum nitride, and molybdenum titanium nitride.

Step 106: depositing a second passivation layer on the surface of the array substrate on which step 105 is completed and performing a patterning process on the second passivation layer.

Step 107: performing the processes of deposition, photolithography and etching of the transparent conductive film on the surface of the array substrate on which step 106 is completed, to complete the patterning of the pixel electrodes.

For the second case described above, that is, the black matrix is provided on the passivation layer on the organic flat layer and the layer of common electrodes, the method for manufacturing an array substrate according to an embodiment of the present disclosure is same as the method for the first case in addition that step 105 and step 106 need to be exchanged in sequence.

For the third case described above, that is, the black matrix is provided on the layer of pixel electrodes on the organic flat layer, the layer of common electrodes and the passivation layer, the method for manufacturing an array substrate according to an embodiment of the present disclosure is same as the method for the first case in addition that step 105 and step 107 need to be exchanged in sequence.

The above three cases describe separately the specific locations of the black matrix in the array substrate. As can be seen from FIGS. 2, 4, and 5, the location of the black matrix is not limited and the black matrix may be selectively provided on the layer of common electrodes 8, the passivation layer 9, or the layer of pixel electrodes 10 as desired or as required by a manufacturing process.

In addition, the black matrix may be provided at other locations as long as the black matrix is the convex curved structure and the region corresponding to the outward convex curved surface in the predetermined layer below the black matrix has the convex curved structure having a thickness larger than a thickness of the flat area. The method for manufacturing an array substrate according to an embodiment of the present disclosure is also applicable to a case where a black matrix is manufactured by using a material of metal or metal alloy in the IPS mode, the VA mode, or the TN mode.

The method according to an embodiment of the present disclosure can be used to manufacture the array substrate of embodiments of the present disclosure. Since the black matrix is no longer a flat surface, the effect of its specular reflection is greatly reduced, the reflectivity of the display panel is reduced, and the picture quality is improved.

The foregoing embodiments are merely illustrative of the technical solutions of the present disclosure and are not intended to be limiting thereof. Although the disclosure has been described in detail with reference to the foregoing embodiments, it will be understood by those of ordinary skill in the art that the technical solutions of the foregoing embodiments may be modified or some of the technical features therein may be substituted in an equivalent way, and such modifications or substitutions do not depart from the spirit and scope of the technical solutions of the various embodiments of the present disclosure.

What is claimed is:

1. An array substrate comprising:
   a color filter;
   an organic flat layer formed on the color filter;
   a layer of common electrodes formed on the organic flat layer, wherein the organic flat layer is located between the color filter and the layer of common electrodes; and
   a black matrix formed on the layer of common electrodes, wherein the layer of common electrodes is located between the organic flat layer and the black matrix and both the organic flat layer and the layer of common electrodes are located between the color filter and the black matrix;
   wherein the array substrate further comprises a plurality of pixel regions arranged in an array and the black matrix is located between the pixel regions, wherein the black matrix comprises an outward convex curved surface and a material of the black matrix comprises at least one of metal, metal oxide, and metal nitride,
   wherein a thickness of the black matrix is uniform, and a region corresponding to the outward convex curved surface in the organic flat layer below the black matrix has a convex curved structure having a thickness larger than a thickness of a flat area, and
   wherein a height difference between an apex of the convex curved structure of the organic flat layer and an upper surface of the flat area is greater than 1 µm.

2. The array substrate according to claim 1, further comprising a passivation layer between the organic flat layer and the black matrix, wherein the black matrix is on the passivation layer.

3. The array substrate according to claim 1, further comprising a passivation layer, and a layer of pixel electrodes between the organic flat layer and the black matrix, wherein the black matrix is on the layer of pixel electrodes.

4. The array substrate according to claim 1, wherein a material of the black matrix comprises i) at least one of molybdenum, chromium, aluminum, titanium, and copper, ii) at least one of the corresponding metal oxide and metal nitride of the molybdenum, chromium, aluminum, titanium, and copper, or iii) at least one of molybdenum tantalum oxide, molybdenum titanium oxide, molybdenum tantalum nitride, and molybdenum titanium nitride.

5. A display device comprising an array substrate as claimed in claim 1.

6. A method for manufacturing an array substrate comprising:
    forming a plurality of pixel regions arranged in an array on a substrate on which a black matrix is not provided;
    forming the black matrix comprising an outward convex curved surface between the pixel regions, wherein a material of the black matrix comprises at least one of metal, metal oxide, and metal nitride; and
    forming a region corresponding to the outward convex curved surface of the black matrix as a convex curved structure having a thickness larger than a thickness of a flat area when forming an organic flat layer below the black matrix before forming the black matrix, wherein a thickness of the black matrix is uniform,
    wherein a height difference between an apex of the convex curved structure of organic flat layer and an upper surface of the flat area is greater than 1 μm,
    the method further comprising:
    forming a color filter;
    forming the organic flat layer on the color filter; and
    forming a layer of common electrodes on the organic flat layer, wherein the layer of common electrodes is located between the organic flat layer and the black matrix and both the organic flat layer and the layer of common electrodes are located between the color filter and the black matrix, wherein the black matrix is formed on the layer of common electrodes, and wherein the organic flat layer is located between the color filter and the layer of common electrodes.

7. The method for manufacturing an array substrate according to claim 6, further comprising:
    using a gray-scale exposure process to form the outward convex curved structure when forming the organic flat layer.

8. The method for manufacturing an array substrate according to claim 6, further comprising forming a passivation layer between forming the organic flat layer and forming the black matrix, wherein the black matrix is on the passivation layer.

9. The method for manufacturing an array substrate according to claim 6, further comprising forming a passivation layer, and a layer of pixel electrodes between forming the organic flat layer and forming the black matrix, wherein the black matrix is on the layer of pixel electrodes.

10. The method for manufacturing an array substrate according to claim 6, wherein the material of the black matrix comprises i) at least one of molybdenum, chromium, aluminum, titanium, and copper, ii) at least one of the corresponding metal oxide and metal nitride of the molybdenum, chromium, aluminum, titanium, and copper, or iii) at least one of molybdenum tantalum oxide, molybdenum titanium oxide, molybdenum tantalum nitride, and molybdenum titanium nitride.

* * * * *